(12) United States Patent
Luk et al.

(10) Patent No.: US 9,799,798 B1
(45) Date of Patent: Oct. 24, 2017

(54) THERMAL EMITTER COMPRISING NEAR-ZERO PERMITTIVITY MATERIALS

(71) Applicant: National Technology & Engineering Solutions of Sandia, LLC, Albuquerque, NM (US)

(72) Inventors: Ting S. Luk, Albuquerque, NM (US); Salvatore Campione, Albuquerque, NM (US); Michael B. Sinclair, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/379,786

(22) Filed: Dec. 15, 2016

(51) Int. Cl.
*H01L 33/26* (2010.01)
*H01L 33/06* (2010.01)
*H01L 33/30* (2010.01)
*H01L 33/00* (2010.01)

(52) U.S. Cl.
CPC .......... *H01L 33/06* (2013.01); *H01L 33/0025* (2013.01); *H01L 33/30* (2013.01)

(58) Field of Classification Search
None
See application file for complete search history.

(56) References Cited

U.S. PATENT DOCUMENTS 5,995,529 A * 11/1999 Kurtz ................ B82Y 20/00
257/94

OTHER PUBLICATIONS

Sasaki et al. "Energy Band Structure and Lattice Constant Chart of III-V Mixed Semiconductors, and AlGaSb/AlGaAsSb Semiconductor Lasers on GaSb Substrates", Japanese Journal of Applied Physics, vol. 19, No. 9, Sep. 1980, pp. 1695-1702, Copyright (c) 1980 The Japan Society of Applied Physics.*
Vassant, S. et al., "Berreman mode and epsilon near zero mode", Optics Express, 2012, pp. 23971-23977, vol. 20.
Vassant, S. et al., "Epsilon-Near-Zero Mode for Active Optoelectronic Devices", Physical Review Letters, 2012, pp. 237401-1-237401-5, vol. 109.
Campione, S. et al., "Theory of epsilon-near-zero modes in ultrathin films", Physical Review B, 2015, pp. 121408-1-121408-5, vol. 91.
Jun, Y. C. et al., "Doping-tunable thermal emission from plasmon polaritons in semiconductor epsilon-near-zero thin films", Applied Physics Letters, 2014, pp. 131109-1-131109-5, vol. 105.
Vassant, S. et al., "Electrical modulation of emissivity", Applied Physics Letters, 2013, pp. 081125-1-081125-3, vol. 102.
Campione, S. et al., "Optical properties of transiently-excited semiconductor hyperbolic metamaterials", Optical Materials Express, 2015, 245992, vol. 5.

(Continued)

*Primary Examiner* — Sitaramarao S Yechuri
(74) *Attorney, Agent, or Firm* — Kevin W. Bieg

(57) ABSTRACT

A novel thermal source comprising a semiconductor hyperbolic metamaterial provides control of the emission spectrum and the angular emission pattern. These properties arise because of epsilon-near-zero conditions in the semiconductor hyperbolic metamaterial. In particular, the thermal emission is dominated by the epsilon-near-zero effect in the doped quantum wells composing the semiconductor hyperbolic metamaterial. Furthermore, different properties are observed for s and p polarizations, following the characteristics of the strong anisotropy of hyperbolic metamaterials.

8 Claims, 17 Drawing Sheets

(56) References Cited

OTHER PUBLICATIONS

Hoffman, A. J. et al., "Negative refraction in semiconductor metamaterials", Nature Materials, 2007, pp. 946-950, vol. 6.
Hoffman, A. J. et al., "Midinfrared semiconductor optical metamaterials", Journal of Applied Physics, 2009, pp. 122411-1-122411-7, vol. 105.
Shekhar, P. et al., "Strong coupling in hyperbolic metamaterials", Physical Review B, 2014, pp. 045313-1-345313-9, vol. 90.
Campione, S. et al., "Realizing high-quality, ultralarge momentum states and ultrafast topological transitions using semiconductor hyperbolic metamaterials", Journal of the Optical Society of America B, 2015, pp. 1809-1815, vol. 32.
Noginov, M. A. et al., "Thermal radiation of lamellar metal-dielectric metamaterials and metallic surfaces", Opical Vlaterials Express, 2015, 231431, vol. 5.
Delteil, A. et al., "Charge-Induced Coherence between Intersubband Plasmons in a Quantum Structure", Physical Review Letters, 2012, pp. 246808-1-246808-5, vol. 109.
Askenazi, B. et al., "Ultra-strong light—matter coupling for designer Reststrahlen band", New Journal of Physics, 2014, 043029, vol. 16.
Campione, S. et al., "Electric field enhancement in $\epsilon$-near-zero slabs under TM-polarized oblique incidence", Physical Review B, 2013, pp. 035120-1-035120-11, vol. 87.

\* cited by examiner

Effective Medium Model

THERMAL EMITTER COMPRISING NEAR-ZERO PERMITTIVITY MATERIALS

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to infrared light sources and, in particular, to a thermal emitter comprising near-zero permittivity materials.

BACKGROUND OF THE INVENTION

The mid-infrared region of the electromagnetic spectrum (wavelengths of 2.5-25 μm; frequencies of 4000 cm$^{-1}$ to 400 cm$^{-1}$) is highly interesting in many applications such as spectroscopy, sensing, and thermography. See B. Stuart, *Infrared Spectroscopy: Fundamentals and Applications*, John Wiley (2004); H. Jane and P. T. Ralph, *Measurement Science and Technology* 24, 012004 (2013); and M. Carosena and M. C. Giovanni, *Measurement Science and Technology* 15, R27 (2004). In this frequency range, only a few kinds of light sources are available, mainly quantum cascade lasers and thermal sources (blackbodies). Thermal sources can be inexpensive, but suffer from poor efficiencies which can be as low as 10$^{-4}$ for spectroscopic applications. See D. Costantini et al., *Physical Review Applied* 4, 014023 (2015). Because convection losses can be suppressed by operating under vacuum and conduction losses can be suppressed by a proper design, the ultimate efficiency limit for incandescent sources appears to be due to emission into unwanted frequencies and directions. See G. Brucoli et al., *Applied Physics Letters* 104, 081101 (2014).

The development of novel thermal sources that control the emission spectrum and the angular emission pattern is thus of fundamental importance. In the last few years, research on thermal radiation has led to the achievement of 1) spatially coherent (i.e. directional) or 2) temporally coherent (i.e. narrow-band) thermal sources by using wavelength-scale optical structures. See J.-J. Greffet et al., *Nature* 416, 61 (2002); N. Dahan et al., *Physical Review B* 76, 045427 (2007); I. Celanovic et al., *Physical Review B* 72, 075127 (2005); S. E. Han and D. J. Norris, *Opt. Express* 18, 4829 (2010); C. Arnold et al., *Physical Review B* 86, 035316 (2012); J. Drevillon and P. Ben-Abdallah, *Journal of Applied Physics* 102, 114305 (2007); B. J. Lee et al., *Opt. Express* 16, 11328 (2008); X. Liu et al., *Physical Review Letters* 107, 045901 (2011); P. Bouchon et al., *Opt. Lett.* 37, 1038 (2012); D. L. C. Chan et al., *Opt. Express* 14, 8785 (2006); J. A. Mason et al., *Applied Physics Letters* 98, 241105 (2011); and S. Vassant et al., *Applied Physics Letters* 102, 081125 (2013). A few recent papers even succeeded in combining both properties of directionality and monochromaticity using diffraction order engineering in periodic structures. See D. Costantini et al., *Physical Review Applied* 4, 014023 (2015); and M. De Zoysa et al., *Nat Photon* 6, 535 (2012). It is also desirable that thermal radiation sources be capable of rapid modulation.

Structures displaying a so-called epsilon-near-zero (ENZ) mode have been studied as potential thermal sources. See S. Vassant et al., *Opt. Express* 20, 23971 (2012); and S. Vassant et al., *Physical Review Letters* 109, 237401 (2012); and S. Campione et al., *Physical Review B* 91, 121408 (2015). Thermal-radiation control has been demonstrated from such ENZ devices and electrical control of the reflectivity and emissivity have been shown. See Y. C. Jun et al., *Applied Physics Letters* 105, 131109 (2014); S. Vassant et al., *Physical Review Letters* 109, 237401 (2012); and S. Vassant et al., *Applied Physics Letters* 102, 081125 (2013). Very recently, high-speed modulation of thermal emission has been demonstrated using a quantum well stack and a photonic crystal. See T. Inoue et al., *Nat Mater* 13, 928 (2014).

However, a need remains for a thermal emitter comprising near-zero permittivity materials wherein the frequency (wavelength) and directionality of the emitter can be accurately controlled.

SUMMARY OF THE INVENTION

The present invention is directed to a thermal emitter comprising a semiconductor hyperbolic metamaterial comprising periodic alternating layers of a doped semiconductor material and an undoped semiconductor material forming a plurality of quantum wells, wherein the period is subwavelength to emitted infrared light and wherein the wavelength of emitted infrared light occurs near the epsilon-near-zero condition of the doped semiconductor material layers. The wavelength of the emitted infrared light can be between 2.5 and 25 microns. The periodicity can be deeply sub-wavelength to the emitted infrared light. A number of doped and undoped semiconductor material combinations can be used to form the quantum wells. For example, the doped semiconductor material can comprise InGaAs and the undoped semiconductor material can comprise InAlAs. For example, the doped semiconductor material can comprise GaAs and the undoped semiconductor material can comprise AlGaAs. For example, the doped semiconductor material can comprise InAs and the undoped semiconductor material can comprise GaSb.

The thermal radiation properties of semiconductor hyperbolic metamaterials of the present invention are theoretically and experimentally analyzed below. In contrast to the nearly flat and featureless mid-infrared thermal radiation spectrum observed in recent work on layered metal/dielectric hyperbolic metamaterials, strong directive and monochromatic emission features are found in proximity to the epsilon-near-zero frequency of the doped quantum wells of the SHM. This thermal emission behavior is obtained without the use of any periodic corrugation. Different thermal radiation properties are observed for s- and p-polarizations. Though all the thermal radiation characteristics are well recovered using an effective medium model for the SHM stack, their physical origin requires knowledge of the optical characteristics of the layers composing the SHM stack.

BRIEF DESCRIPTION OF THE DRAWINGS

The detailed description will refer to the following drawings, wherein like elements are referred to by like numbers.

In FIGS. 1B and 1D, solid and dashed lines indicate real and imaginary parts of the permittivity, respectively. The vertical dashed lines in FIG. 1D separate frequency regions with a type-II hyperbolic dispersion (T-II), an elliptic dispersion (E), and a type-I hyperbolic dispersion (T-I).

FIG. 10A is for the SHM case of 60 periods of alternately 11 nm doped layers and 4 nm undoped layers. FIG. 10B is for the SHM case of 50 periods of alternating 9 nm doped layers and 9 nm undoped layer. FIG. 10C is for the SHM case of 60 periods of alternating 5 nm doped layers and 10 nm undoped layers. The permittivity functions of doped and undoped layers are kept as in FIG. 1B. In the top row panels, solid and dashed lines indicate real and imaginary parts of the permittivity, respectively.

DETAILED DESCRIPTION OF THE INVENTION

Figure 1A:
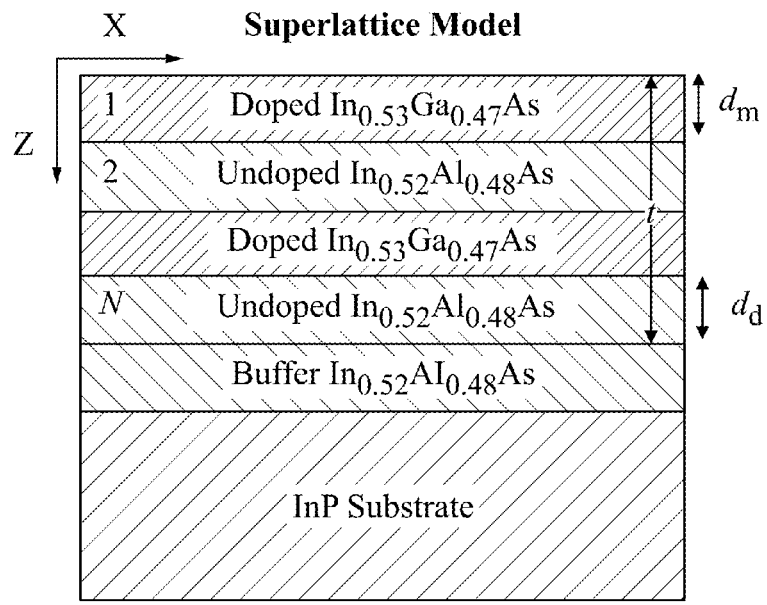
FIG. 1A is a schematic illustration of a semiconductor hyperbolic metamaterial (SHM) made by 50 pairs of alternating 10-nm-thick doped $In_{0.53}Ga_{0.47}As$ and 8-nm-thick undoped $Al_{0.48}In_{0.52}As$ layers. The superlattice is on top of a 200-nm-thick $Al_{0.48}In_{0.52}As$ buffer layer and a 0.65-mm-thick InP substrate.

Hyperbolic materials describe a class of optical materials with extreme anisotropy in their in-plane and out-of-plane permittivity functions. In such materials, the real part of their permittivities are of opposite signs at a particular or a range of frequency. They are called hyperbolic materials, since the isofrequency surfaces of these materials are of hyperbolic shape. There are two types of hyperbolic material: one of which has the in-plane permittivity negative and the out-of-plane positive, called type II; and the other type is called type I, which has the out-of-plane permittivity negative and the in-plane positive. Natural materials can possess this property, such as monolayer of boron nitride. Materials with this property can also be created with a stack of alternating subwavelength layers of negative and positive permittivity materials, or an array of negative permittivity wires in a positive permittivity environment. These engineered heterogeneous materials with hyperbolic properties are called hyperbolic metamaterials.

The present invention is directed to simple multilayer structures that can behave as directive and monochromatic thermal sources in the infrared, without any periodic corrugation. The invention takes advantage of an absorption resonance in a semiconductor hyperbolic metamaterial (SHM). This kind of structure is possible at mid-infrared frequencies where highly doped semiconductor materials behave like metals (i.e. have a large negative real part of the permittivity) so that SHMs can be fabricated using alternating layers of doped and undoped semiconductor materials. See S. Campione et al., *Opt. Mater. Express* 5, 2385 (2015); A. J. Hoffman et al., *Nat Mater* 6, 946 (2007); A. J. Hoffman et al., *Journal of Applied Physics* 105, 122411 (2009); P. Shekhar and Z. Jacob, *Physical Review B* 90, 045313 (2014); and S. Campione et al., *J. Opt. Soc. Am. B* 32, 1809 (2015). Recent work has shown that the thermal radiation properties of layered metal/dielectric hyperbolic metamaterials are nearly flat and featureless in the mid-infrared part of the spectrum, and are not much different from those of simpler metallic structures. See M. A. Noginov et al., *Opt. Mater. Express* 5, 1511 (2015). However, this is not the case when the thermal radiation is generated in proximity of the ENZ frequency of the quantum wells comprising the SHM. To be more precise, the resonance frequency and directivity are driven by an ENZ effect and the optical anisotropy of the hyperbolic metamaterial.

At a given temperature T, wavelength λ, and direction θ, the thermal radiation intensity emitted from a body is $$E^{(e)}(\lambda, T, \theta) = \in_\lambda(\theta) E_b(\lambda, T), \quad (1)$$

where $\in_\lambda(\theta)$ is the emissivity of the device at wavelength λ and direction θ, and $E_b(\lambda, T)$ is the intensity of blackbody radiation at wavelength λ and temperature T determined by Planck's law. The emissivity thus behaves as a "filter" of the blackbody spectral radiance and characterizes the way a given body will emit thermal radiation. The polarization dependence is also included in the emissivity. Kirchhoff's law states that $\alpha_\lambda(\theta) = \in_\lambda(\theta)$ where $\alpha_\lambda(\theta)$ is the absorptivity at wavelength λ in the direction θ. See M. A. Noginov et al., *Opt. Mater. Express* 5, 1511 (2015). This relationship is used below to confirm the spectral and angular properties of thermal radiation of exemplary thermal emitter samples.

Figure 1B:
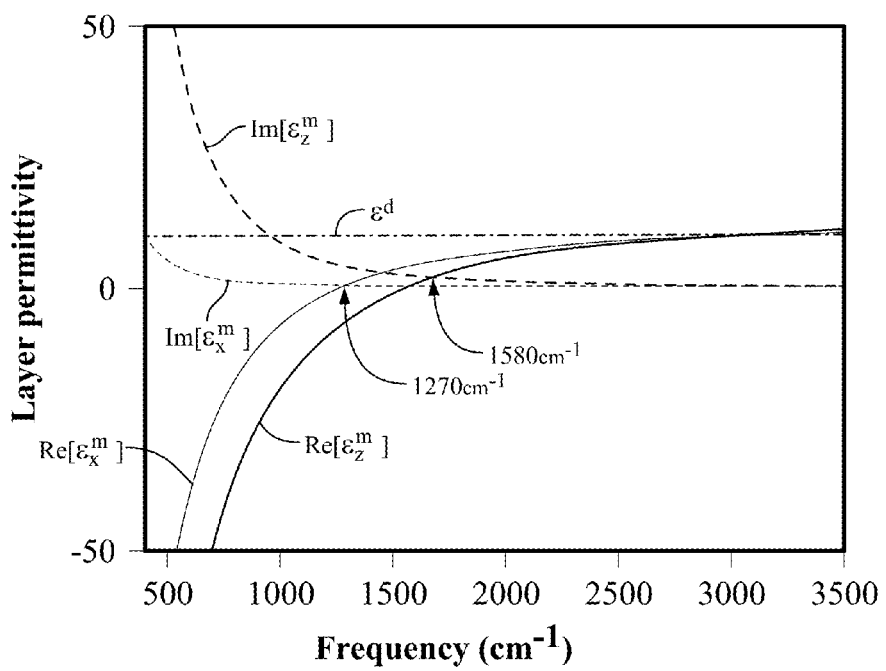
FIG. 1B is a graph of the permittivity functions of the layers comprising the SHM extracted via ellipsometry.

As an example of the invention, a thermal emitter sample was grown using molecular beam epitaxy on a 0.65-mm-thick InP substrate with a 200 nm thick $In_{0.52}Al_{0.48}As$ buffer layer. As shown in FIG. 1A, the sample comprised 50 periods of alternating layers of 10 nm thick $In_{0.53}Ga_{0.47}As$ quantum wells and 8 nm thick $In_{0.52}Al_{0.48}As$ barriers. The $In_{0.53}Ga_{0.47}As$ quantum wells were highly doped ($2 \times 10^{19}$ cm$^{-3}$) and behaved as a metal at low frequencies, while the barriers were undoped and behaved as a dielectric at all frequencies. The sample was characterized using infrared variable angle spectroscopic ellipsometry. Ellipsometry measurements were obtained at five different incidence angles, and spanned the spectral range from 400 to 3500 cm$^{-1}$. These measurements revealed that the doped In$_{0.53}$Ga$_{0.47}$As layer could be described as a uniaxial Drude material, with different Drude model parameters for the in-plane ($\in_x^m$) and out-of-plane ($\in_z^m$) permittivities, where the superscript m indicates that the doped layer acts as the metallic layer. [Note that although the x component was used to describe the in-plane permittivity, the permittivity is isotropic in the x-y plane.] The uniaxial behavior arises due to the electron confinement within the narrow (10 nm) quantum wells, which in turn leads to a blue-shifting of the plasma frequency of $\in_z^m$ relative to that of $\in_x^m$, as shown in FIG. 1B. See A. Delteil et al., *Physical Review Letters* 109, 246808 (2012); and B. Askenazi et al., *New Journal of Physics* 16, 043029 (2014). The ENZ point of the in-plane permittivity ($\in_x^m$) occurs at ~1270 cm$^{-1}$ while that of the out-of-plane permittivity ($\in_z^m$) occurs at ~1580 cm$^{-1}$.

Figure 1C:
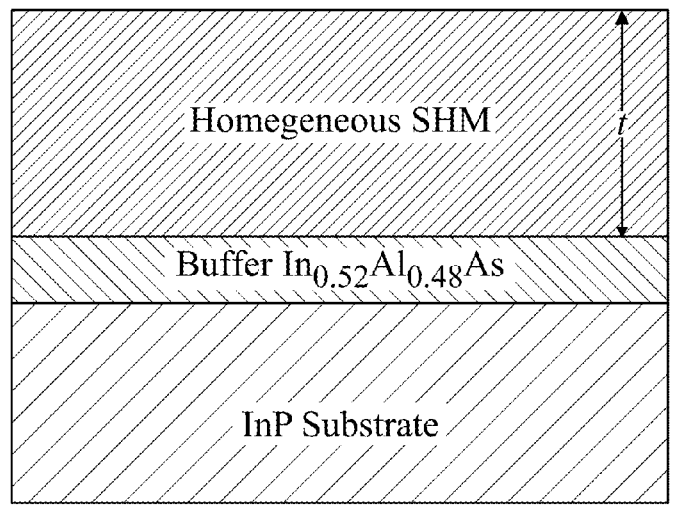
FIG. 1C is a schematic illustration of a homogeneous uniaxial SHM that can be used to model the superlattice shown in FIG. 1A with an effective medium model.

Below, the behavior of the SHM sample is described using two different models. The first model, referred to herein as the superlattice model, calculates the electromagnetic response of the SHM using the transfer matrix method explicitly considering all the layers of the SHM structure. See D. M. Pozar, *Microwave Engineering*. 4th edn, John Wiley and Sons, (2011). The second model, referred to herein as the effective medium model, uses the measured permittivities of the quantum well and barrier layers, along with the local anisotropic effective medium approximation, to describe the SHM as a single uniaxial slab with an in-plane permittivity $\in_x^{eff}$ and an out-of-plane permittivity $\in_z^{eff}$. Specifically, according to the local anisotropic effective medium approximation, the sample in FIG. 1A can be described using a homogeneous, uniaxial permittivity tensor of the kind $\underline{\in}_{HM} = \in_x^{eff} (\hat{x}\hat{x}+\hat{y}\hat{y}) + \in_z^{eff} \hat{z}\hat{z}$, where $$\varepsilon_x^{eff} = \frac{\varepsilon_x^m d_m + \varepsilon^d d_d}{d_m + d_d} \quad (2)$$

is the transverse permittivity along the transverse direction ($\hat{x}\hat{x}+\hat{y}\hat{y}$) (parallel to the layers) and $$\varepsilon_z^{eff} = \left( \frac{d_m / \varepsilon_z^m + d_d / \varepsilon^d}{d_m + d_d} \right)^{-1} \quad (3)$$

is the longitudinal permittivity along the longitudinal direction $\hat{z}\hat{z}$ (perpendicular to the layers). In these expressions $d_d$ and $d_m$ represent respectively the thicknesses of the undoped and doped layers comprising the SHM. See V. M. Agranovich, *Solid State Communications* 78, 747 (1991). The thickness of the effective medium slab, shown in FIG. 1C, is equivalent to the total thickness of the 50 periods of the superlattice, shown in FIG. 1A. In the effective medium model, the electromagnetic properties of the sample are once again calculated using the transfer matrix method, which now substitutes a single uniaxial slab for the 50 period quantum well structure. Both models successfully recover the spectral and angular properties of the thermal radiation of the SHM structure. However, a deeper understanding of the physical origin of the thermal radiation features, which are due to the occurrence of an epsilon-near-zero condition in the doped quantum wells, can only be obtained through use of the superlattice model.

Figure 1D:
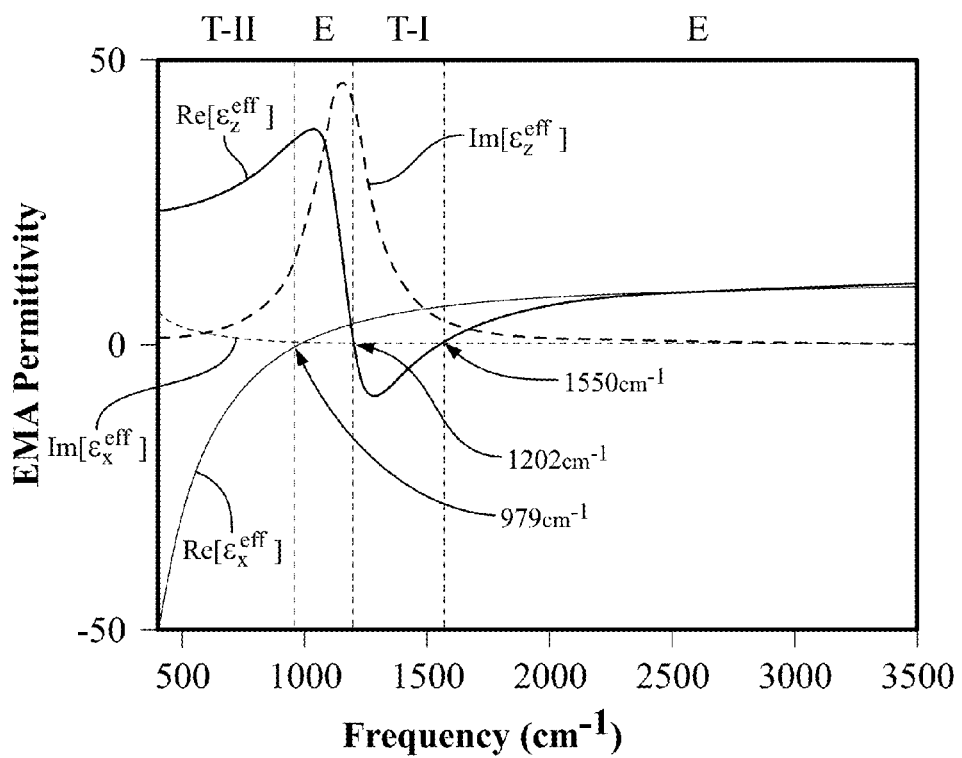
FIG. 1D is a graph of the effective permittivity functions of the homogeneous SHM computed using a local anisotropic effective medium approximation (EMA) through the optical constants in FIG. 1B.
Figure 2A:
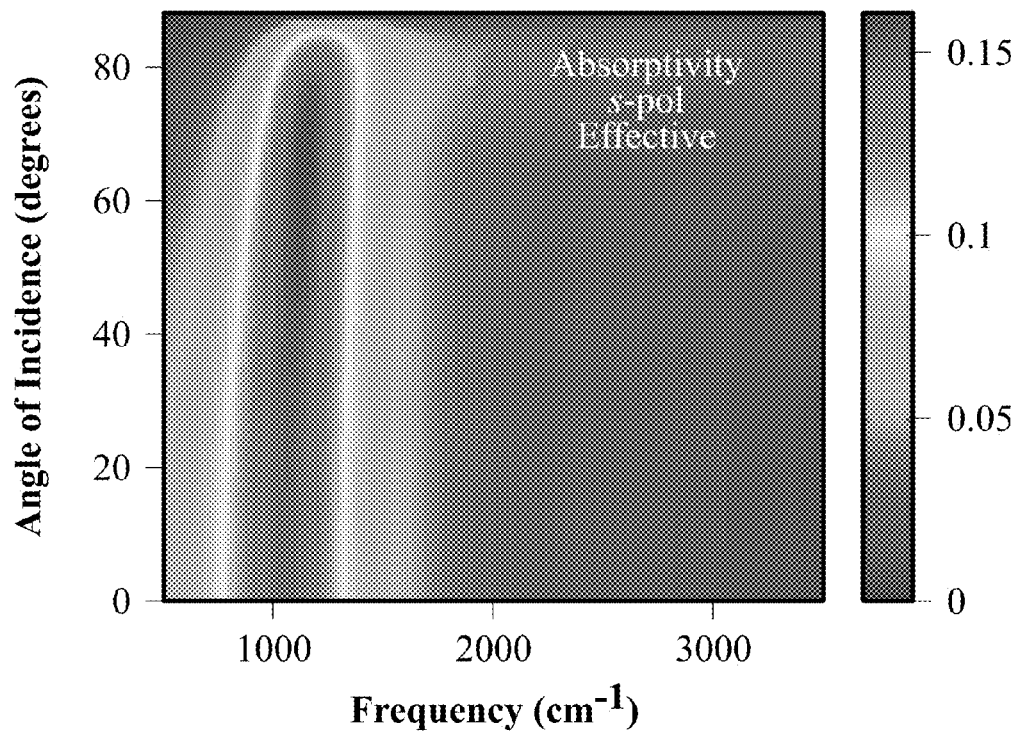
FIGS. 2A and 2B are graphs of the absorptivity versus frequency and incidence angle under s-pol for the SHMs shown in FIGS. 1C and 1A, respectively.
Figure 2B:
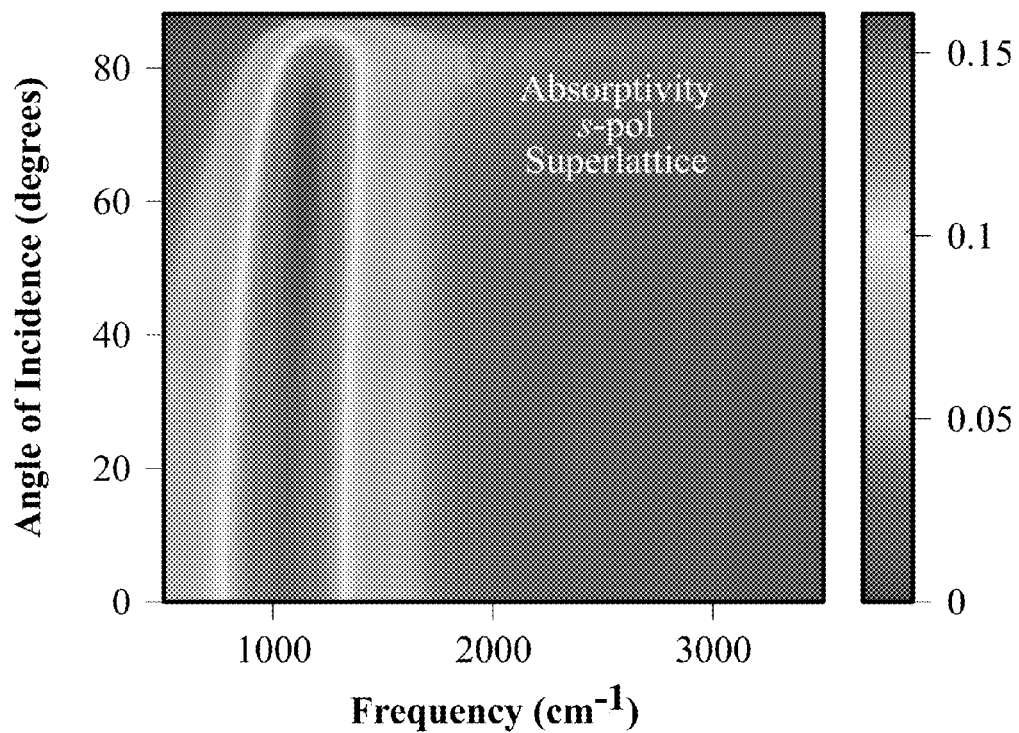
Figure 2C:
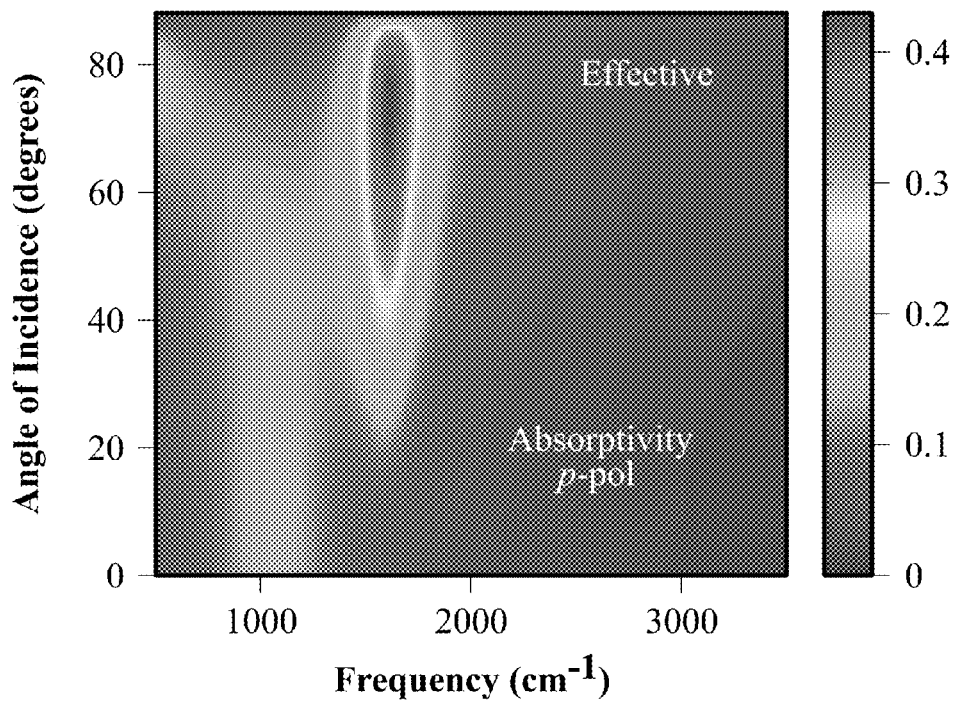
FIGS. 2C and 2D are graphs of the absorptivity versus frequency and incidence angle under p-pol plane wave incidence. The results in FIGS. 2A and 2C were computed using the effective medium approximation. The results in FIGS. 2B and 2D were computed using the superlattice implementation.
Figure 2D:
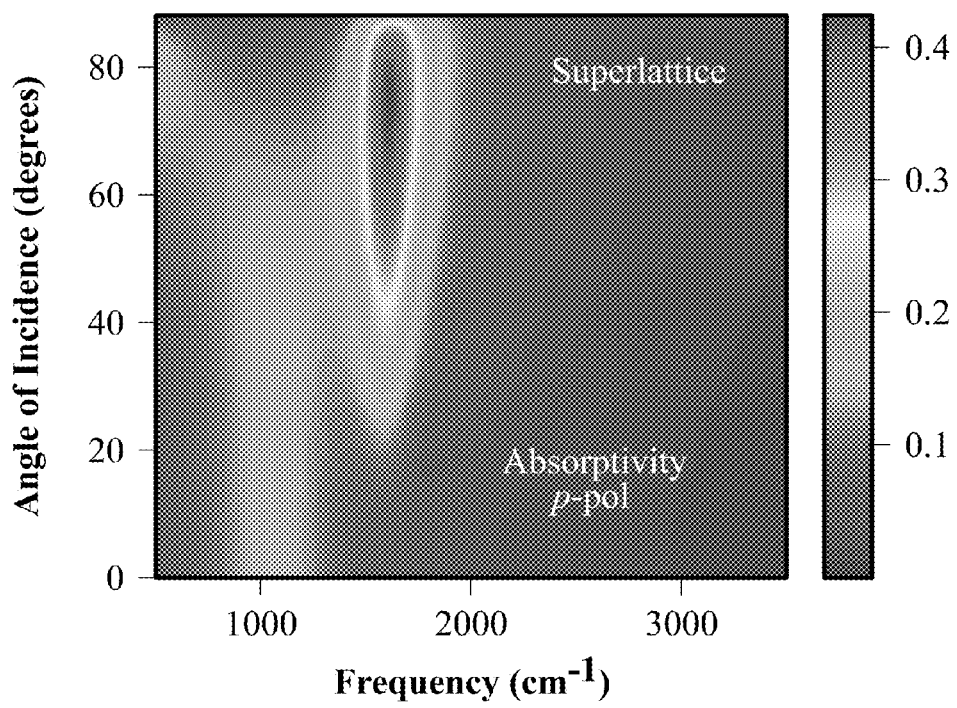
Figure 3A:
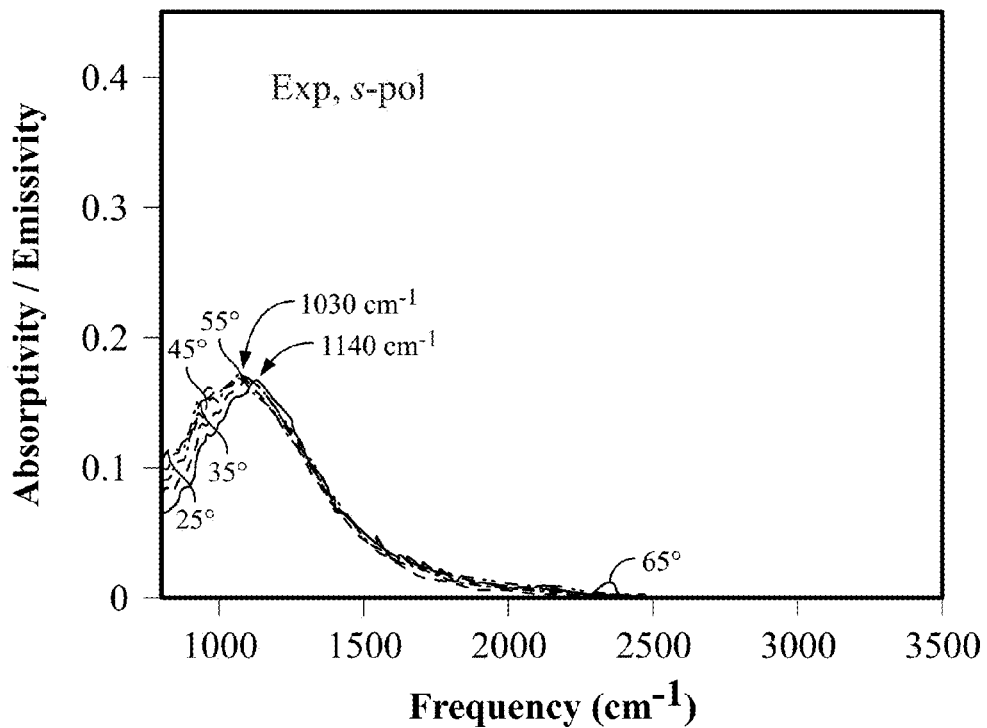
FIGS. 3A and 3B are graphs of the experimental absorptivity/emissivity for s-pol and p-pol light, respectively.
Figure 3B:
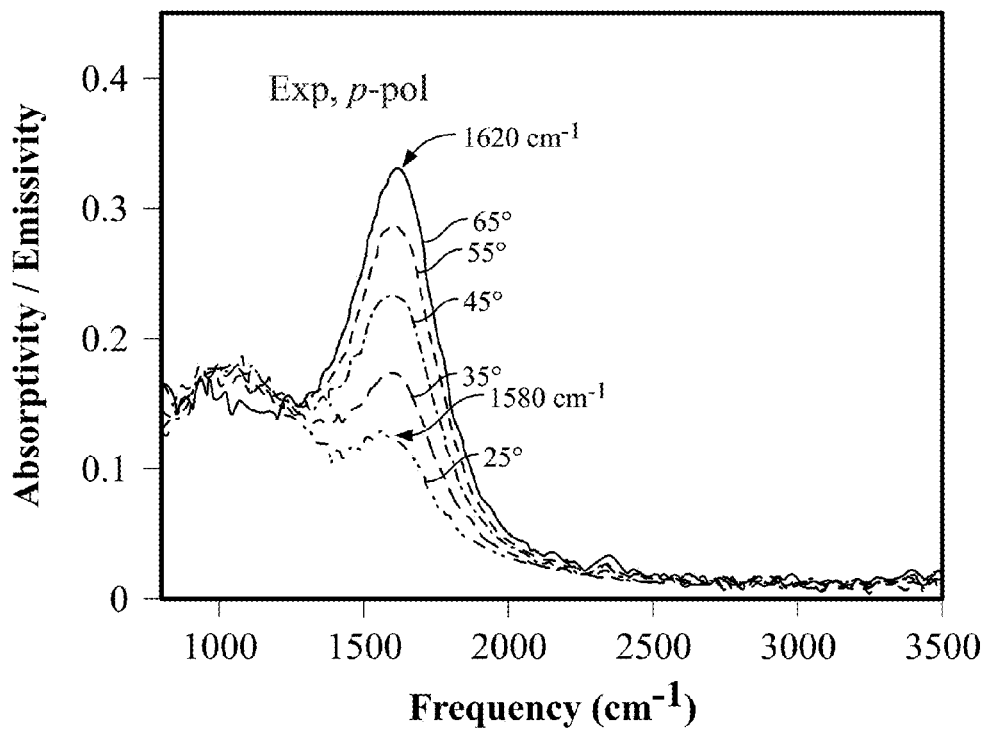
Figure 3C:
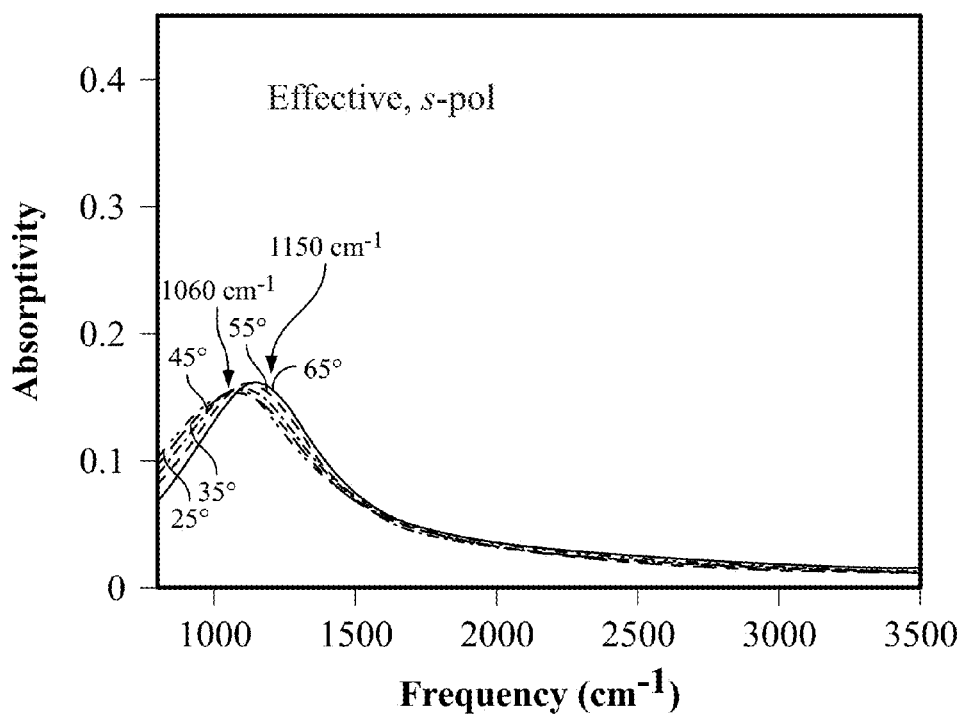
FIGS. 3C and 3D are graphs of the theoretical absorptivity for s-pol and p-pol light, respectively.
Figure 3D:
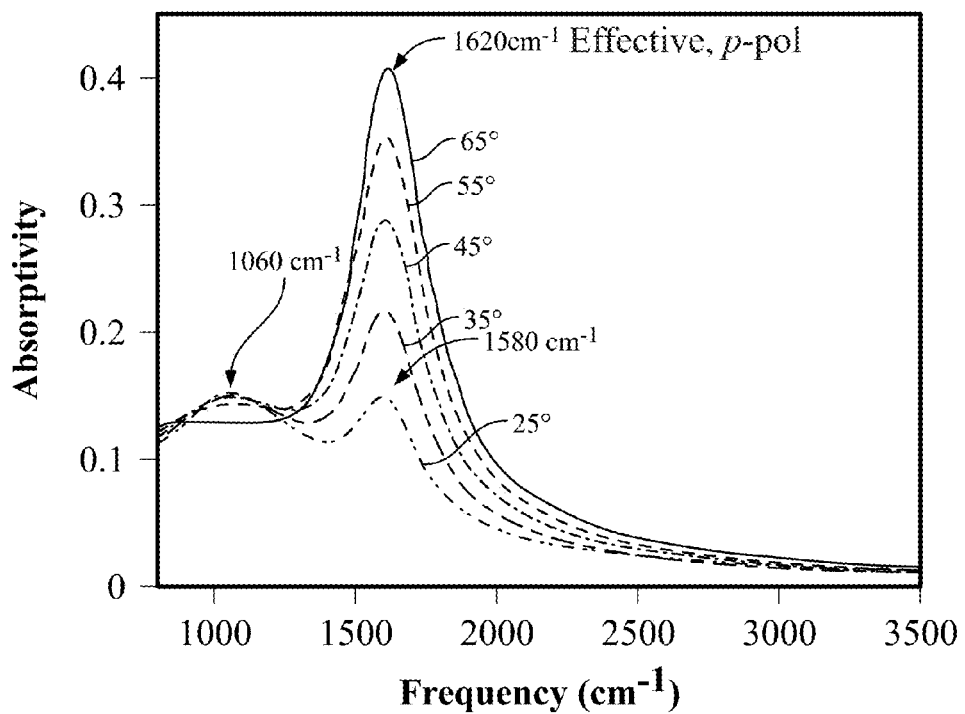

The permittivities obtained using the effective medium model are shown in FIG. 1D, and exhibit the usual anisotropic behavior of hyperbolic metamaterials, where $\in_x^{eff}$ has a Drude-like behavior and $\in_z^{eff}$ a Lorentz-like behavior. In the present case, the SHM exhibits type-II hyperbolic dispersion below ~979 cm$^{-1}$, and type-I hyperbolic dispersion between ~1200 cm$^{-1}$ and ~1550 cm$^{-1}$. The sample exhibits elliptic dispersion in other frequency ranges. In particular, $\in_x^{eff}$ experiences an epsilon-near-zero condition at ~979 cm$^{-1}$, while the ENZ condition of $\in_z^{eff}$ occurs at ~1550 cm$^{-1}$. (The SHM is hyperbolic when $\in_x^{eff} \cdot \in_z^{eff} < 0$. A type-I hyperbolic metamaterial has $\in_z^{eff} < 0$ and $\in_x^{eff} > 0$; whereas a type-II hyperbolic metamaterial has $\in_z^{eff} > 0$ and $\in_x^{eff} < 0$. In these regions, the SHM behaves as a conductor in one direction and an insulator in the other direction. The type-II hyperbolic metamaterial is expected to be highly reflective, since it is more metallic than the type-I hyperbolic metamaterial. When both permittivities are negative, the material behaves as a metal; when both permittivities are positive, the material behaves as dielectric.)

The sample's polarized absorptivity (and hence emissivity) was calculated as 1-R-T, where R and T are the simulated reflectivity and transmissivity, respectively. FIGS. 2A-D show the s-polarized and p-polarized absorptivity versus frequency and incidence angle, calculated using both the superlattice and effective medium models. The agreement of the models is strikingly evident. For s-polarized incidence (FIGS. 2A and 2B), a single absorption feature is observed near ~1060 cm$^{-1}$. For p-polarized incidence (FIGS. 2C and 2D), two features are present at larger angles: a weak feature near ~1060 cm$^{-1}$, and a much stronger feature near ~1600 cm$^{-1}$. The weak feature near 1060 cm$^{-1}$ originates from a slab impedance matching condition (i.e. Fabry-Perot resonance) and is similar in magnitude to the ~1060 cm$^{-1}$ feature observed in s-polarization. See S. Campione et al., *Opt. Mater. Express* 5, 2385 (2015). As will be described below, the strong p-polarized peak observed near ~1600 cm$^{-1}$ is associated with an epsilon-near-zero condition of the doped quantum wells (i.e., when $\in_z^m \sim 0$). Thus, knowledge of the optical characteristics of the component layers of the SHM stack is necessary for a full physical understanding of the observed optical properties.

The sample's absorptivity/emissivity spectra were measured for both s-polarization and p-polarization at several angles of incidence using the ellipsometer. FIGS. 3A-D show comparisons of the experimentally measured absorptivity with the simulated data obtained using the effective medium model. The locations of the measured absorptivity peaks (~1060 cm$^{-1}$ and ~1600 cm$^{-1}$) are in good agreement with the simulations. Furthermore, the increase of absorptivity and blue shift of the ~1600 cm$^{-1}$ peak with increasing angle observed in the experiment are well reproduced by the simulations. A similar blue shift with increasing incidence angle was also observed for transmission by Newman et al. See W. D. Newman et al., *ACS Photonics* 2, 2 (2015).

Figure 4A:
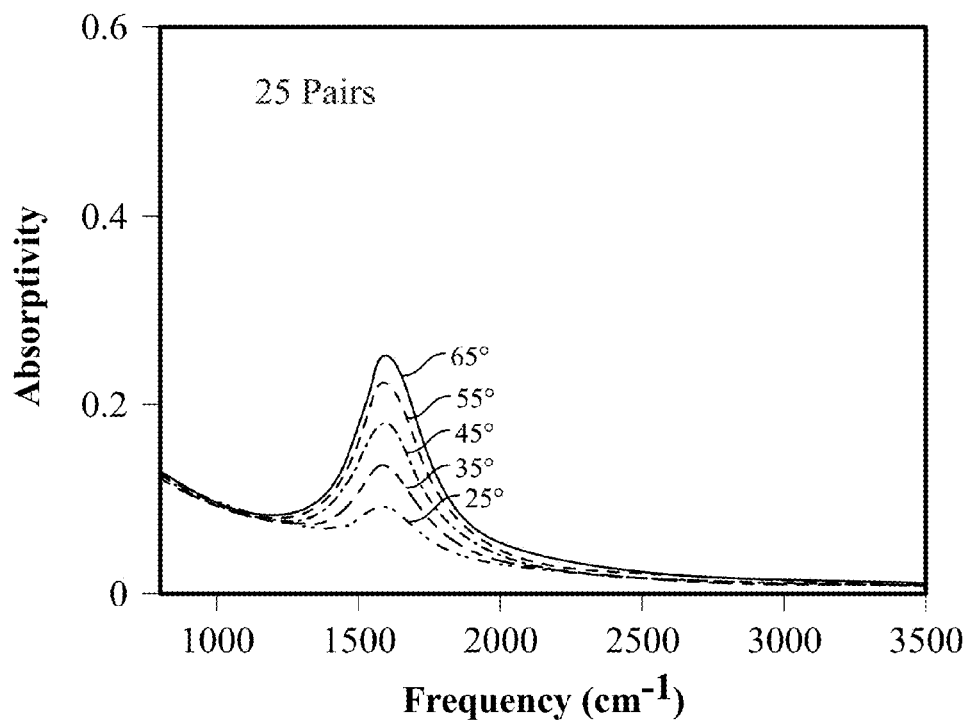
FIGS. 4A, 4B, and 4C are graphs of the theoretical absorptivity for p-pol for a SHM with 25, 50, and 75 pairs, respectively, computed using the superlattice model.
Figure 4B:
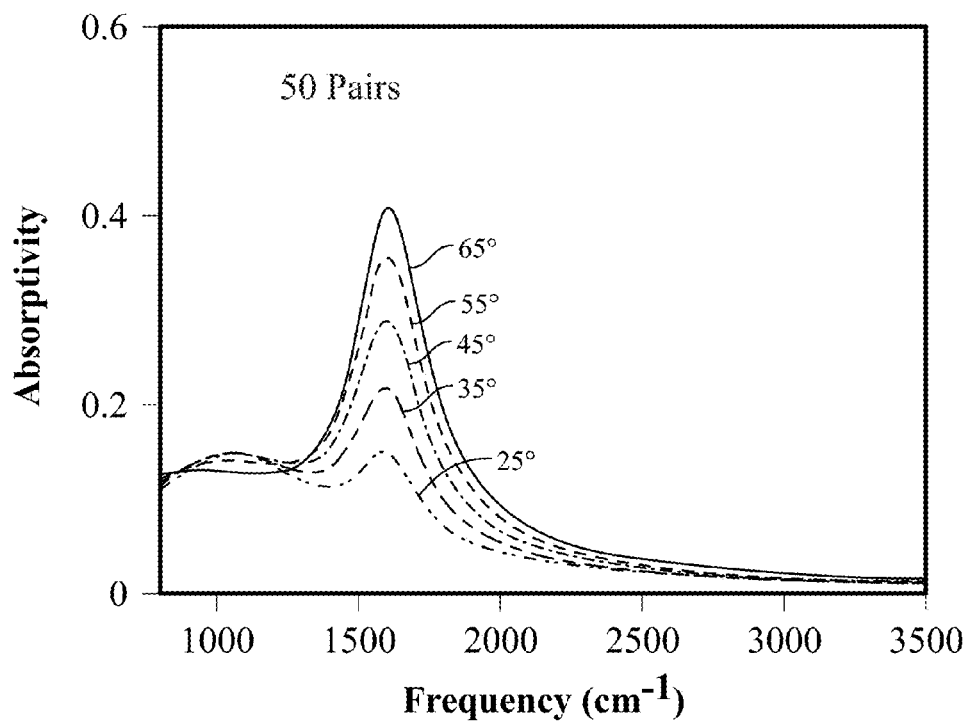
Figure 4C:
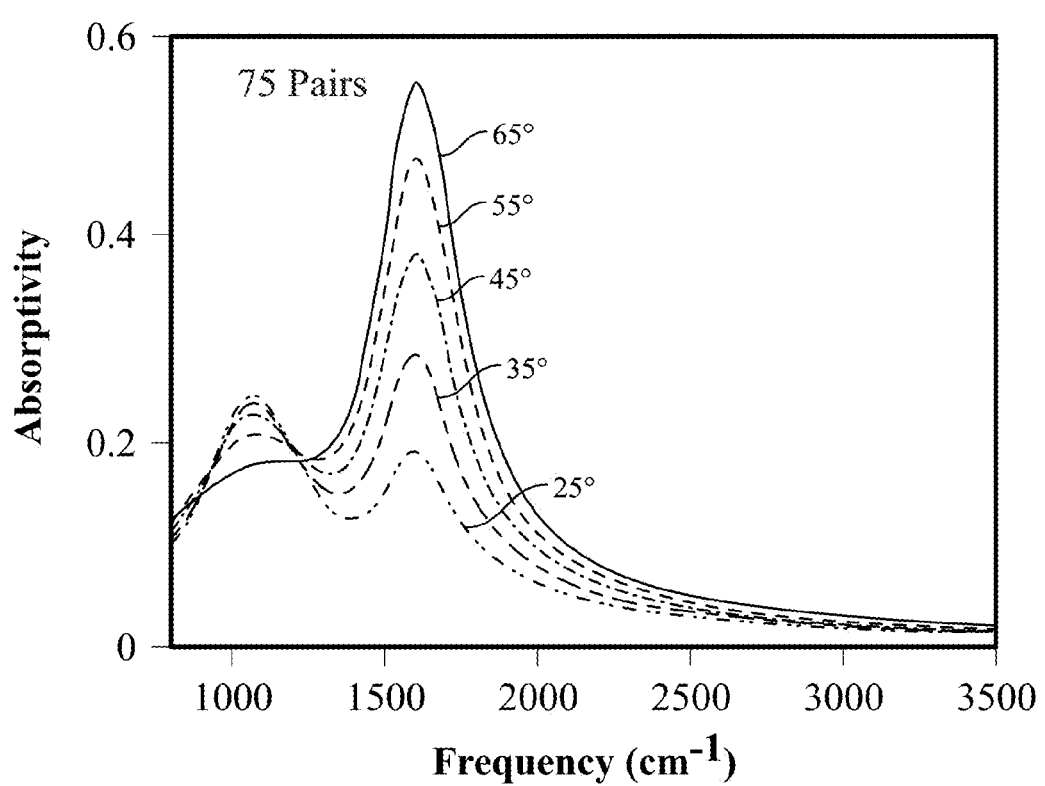

Simulations for the p-polarization absorptivity for 25, 50, and 75 pairs comprising the SHM are shown in FIGS. 4A-C, respectively. While the high absorption close to ~1600 cm$^{-1}$ is present in all the three configurations, the absorption around ~1060 cm$^{-1}$ can be altered, depending on the number of pairs.

Figure 5A:
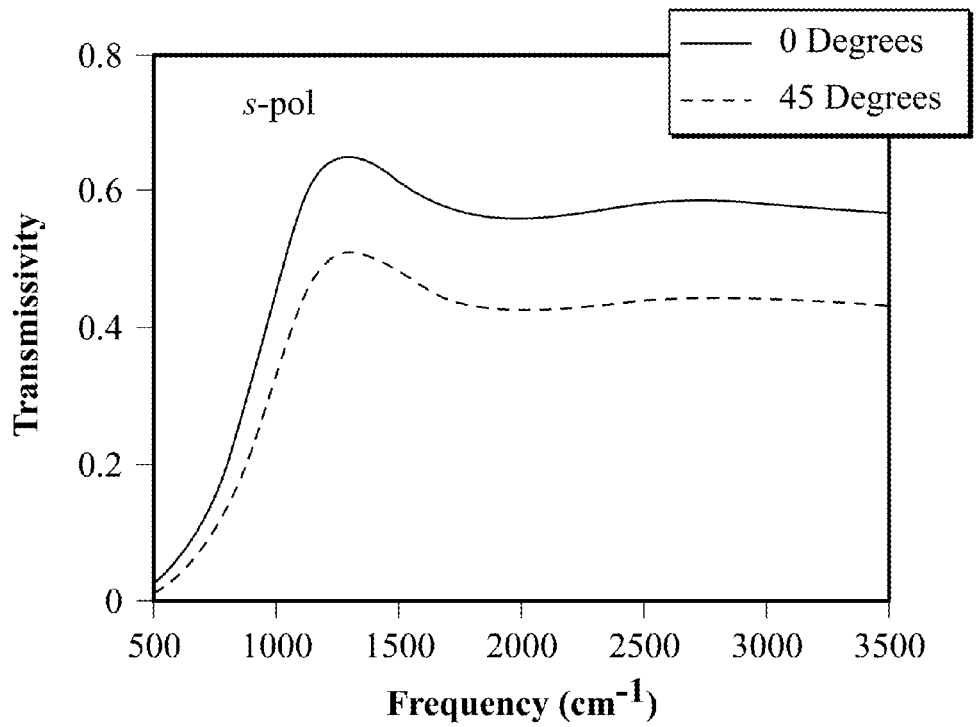
FIGS. 5A and 5B are graphs of the theoretical transmissivity of the sample for s-polarization and p-polarization, respectively, versus frequency for two angles of incidence computed using the superlattice model.
Figure 5B:
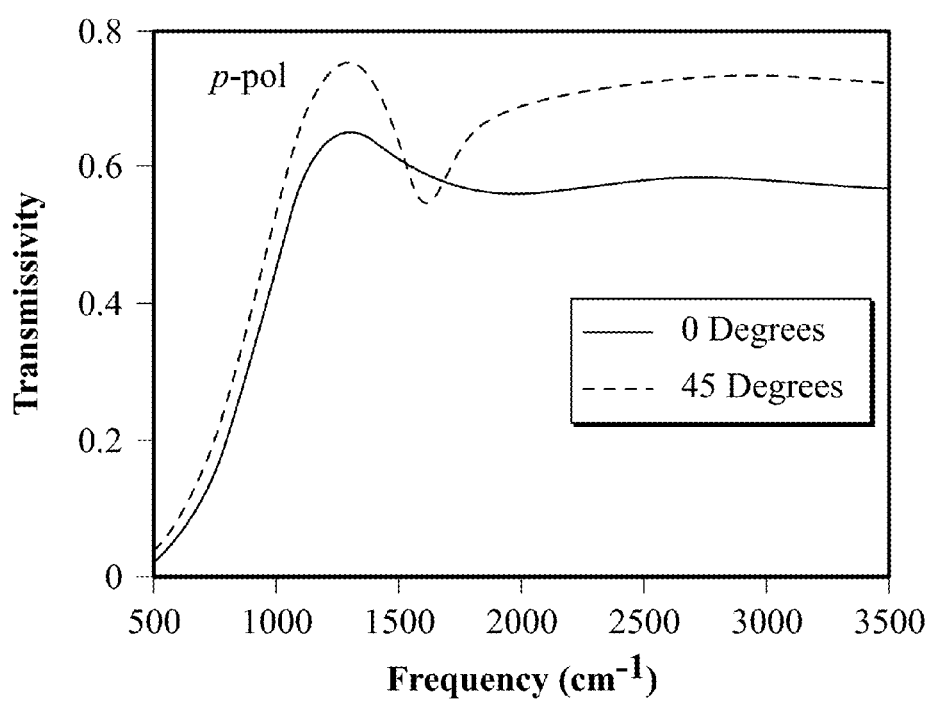

FIGS. 5A and 5B show the theoretical transmissivity (for s- and p-polarization) of the SHM sample versus frequency for two angles of incidence, 0 degrees and 45 degrees, computed using the superlattice model. A low transmissivity is observed in the type-II hyperbolic region (below ~979 cm$^{-1}$), and a high transmissivity is observed in the type-I hyperbolic region (between ~1200 cm$^{-1}$ and ~1550 cm$^{-1}$).

Figure 6A:
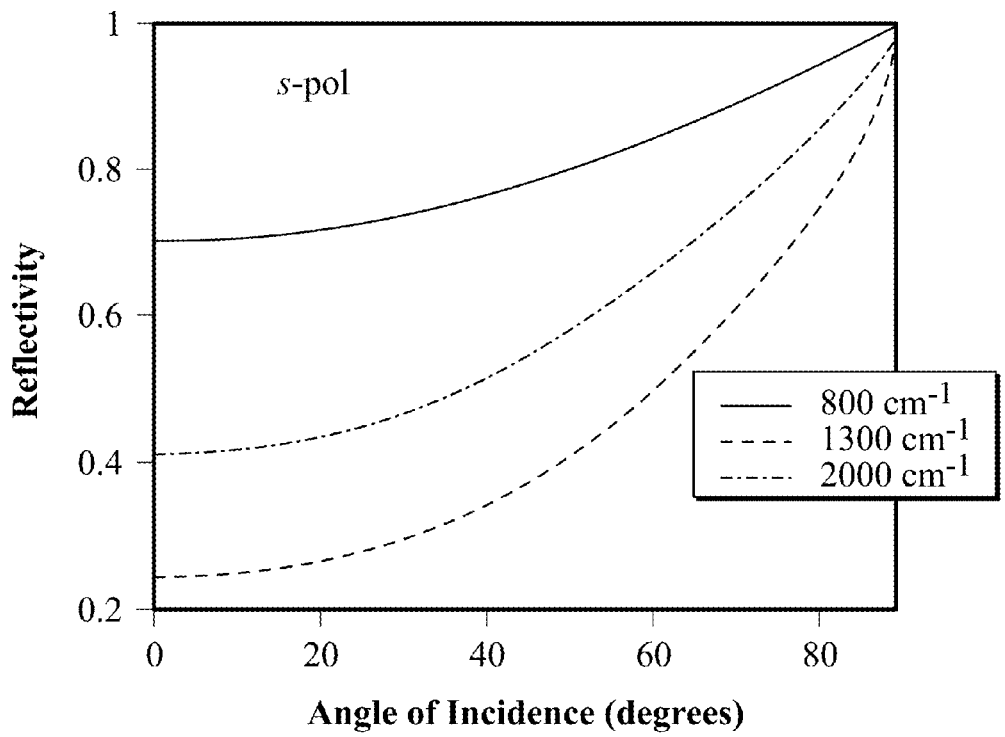
FIGS. 6A and 6B are graphs of the theoretical reflectivity of the sample for s-polarization and p-polarization, respectively, versus angle of incidence for three frequencies computed using the superlattice model.
Figure 6B:
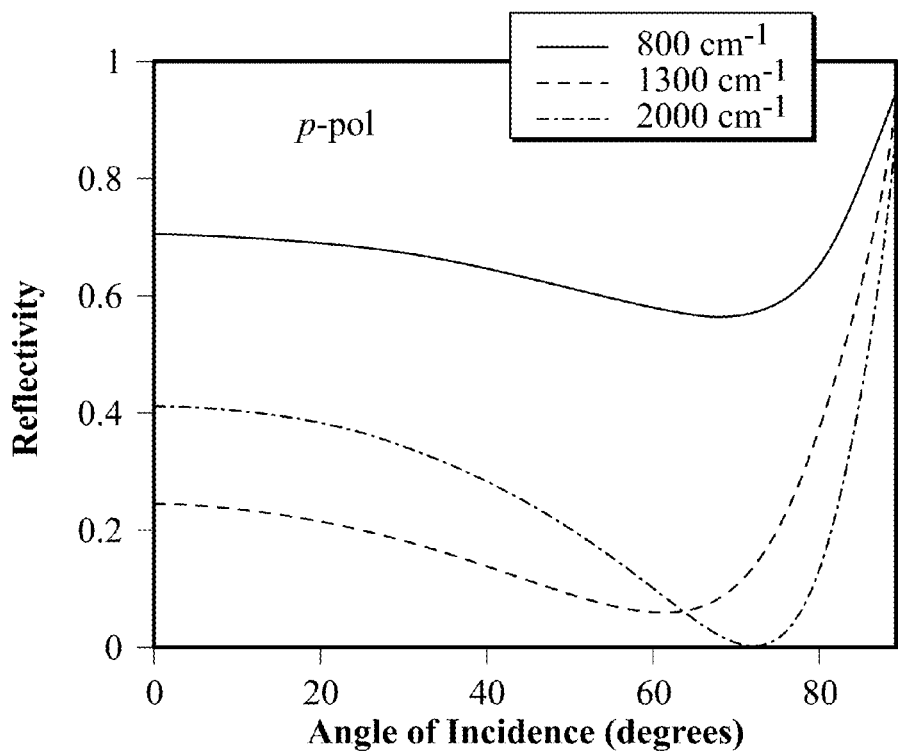

FIGS. 6A and 6B show the theoretical reflectivity (for s- and p-polarization) of the SHM sample versus angle of incidence for three frequencies computed using the superlattice model: at 800 cm$^{-1}$ in the type-II hyperbolic region; at 1300 cm$^{-1}$ in the type-I hyperbolic region; and at 2000 cm$^{-1}$ in the elliptic region. A Brewster angle (i.e. zero reflectivity) is not observed for s-polarization. For p-polarization, a clear Brewster angle is achieved in the elliptic region; a pseudo-Brewster angle is observed in the type-I hyperbolic region; almost no Brewster angle is observed in the type-II hyperbolic region.

Figure 7:
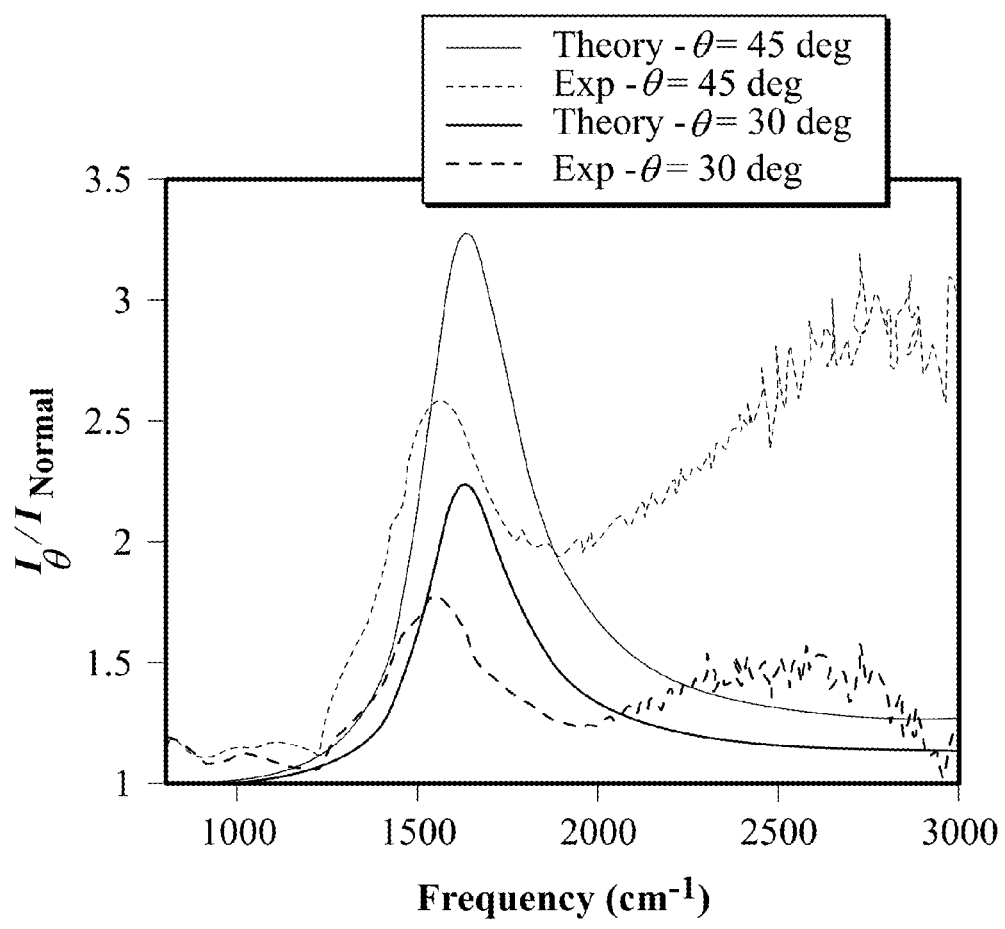
FIG. 7 is a graph of the experimental thermal emission ratio for unpolarized light. The theoretical result was computed for similar conditions.

The sample's thermal emission was measured using custom-built thermal emission measurement setup. See T. S. Luk et al., *Photonics and Nanostructures—Fundamentals and Applications* 6, 81 (2008). For these measurements, the sample mount was heated to a temperature of 300° C. Only unpolarized spectra were obtained since the insertion of a polarizer introduces too much loss in the setup. Measurements were performed at 0, 30, and 45-degree incidence, with and without a sample present. Background measurements, obtained without the sample, were subtracted from the measurement obtained with sample in place. The emission spectra recorded at 30 and 45 degrees were normalized by the normal incidence spectra, and are plotted in FIG. 7 along with simulation results obtained using room temperature permittivities in the superlattice model. The peaks of the experimental emission are observed at ~1580 cm$^{-1}$, in good qualitative agreement with the simulations (some spurious background is present at high frequencies). Thus, the primary feature of the emission spectrum occurs close to the ENZ point of the doped quantum wells. The resonance frequency and directivity of the thermal emission are driven by an ENZ effect and the optical anisotropy of the hyperbolic metamaterial.

Figure 8A:
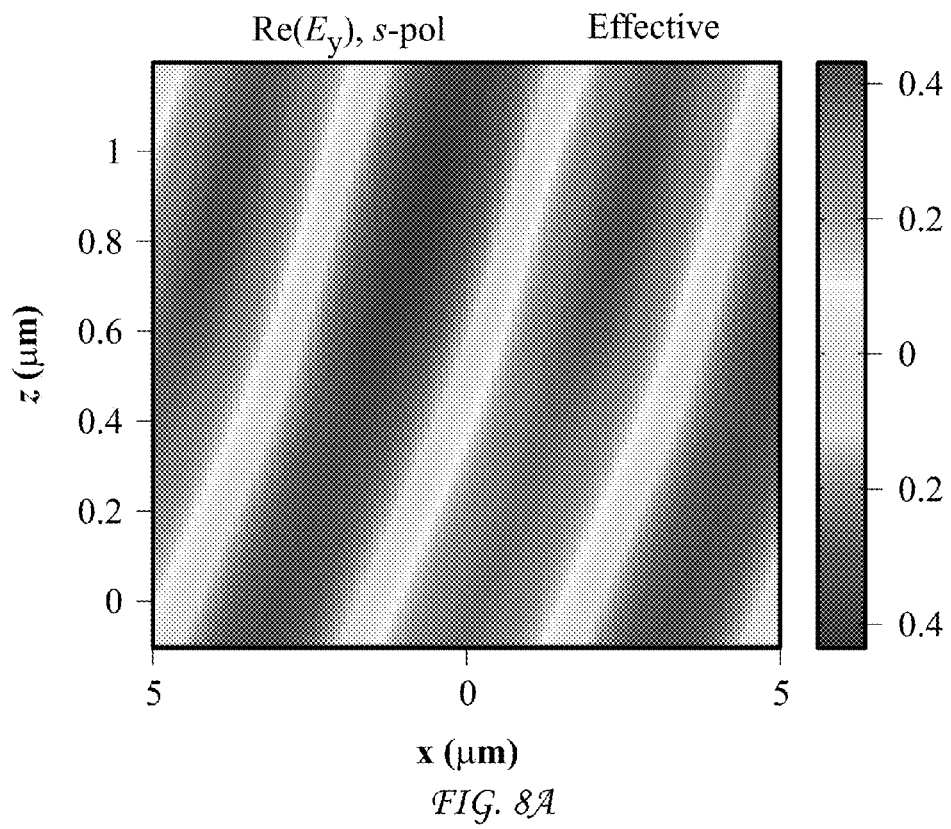
FIGS. 8A and 8B are graphs of field profiles under s-pol incidence at 1620 cm$^{-1}$ and 74 degrees, assuming the finite SHM structure in FIG. 1A with 50 layers.
Figure 8B:
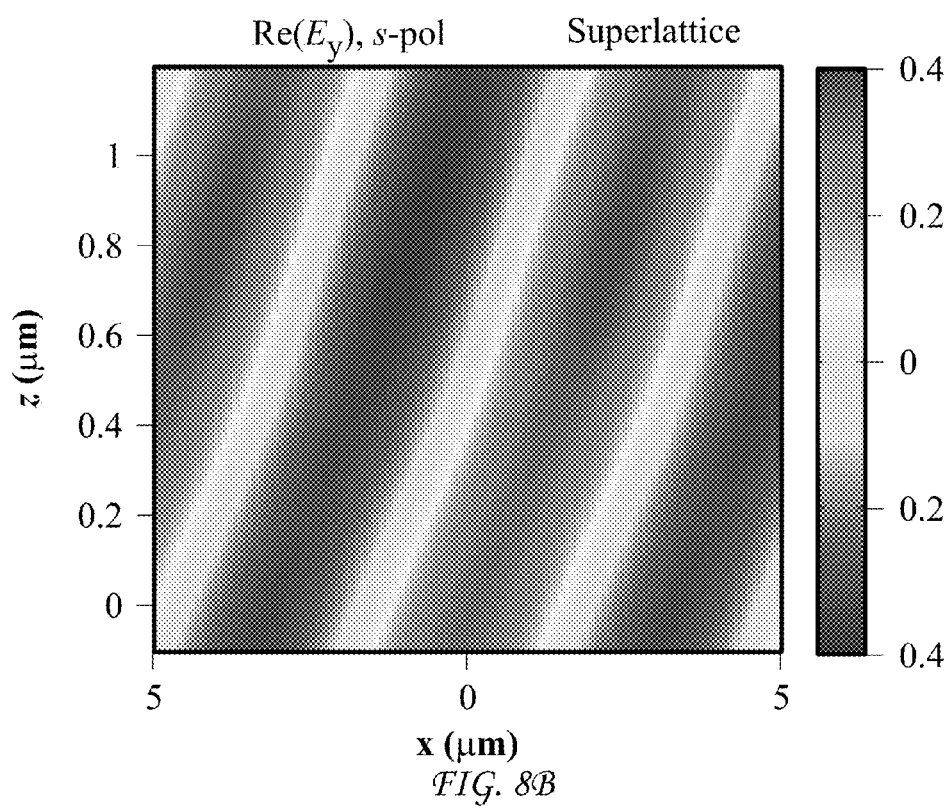
Figure 8C:
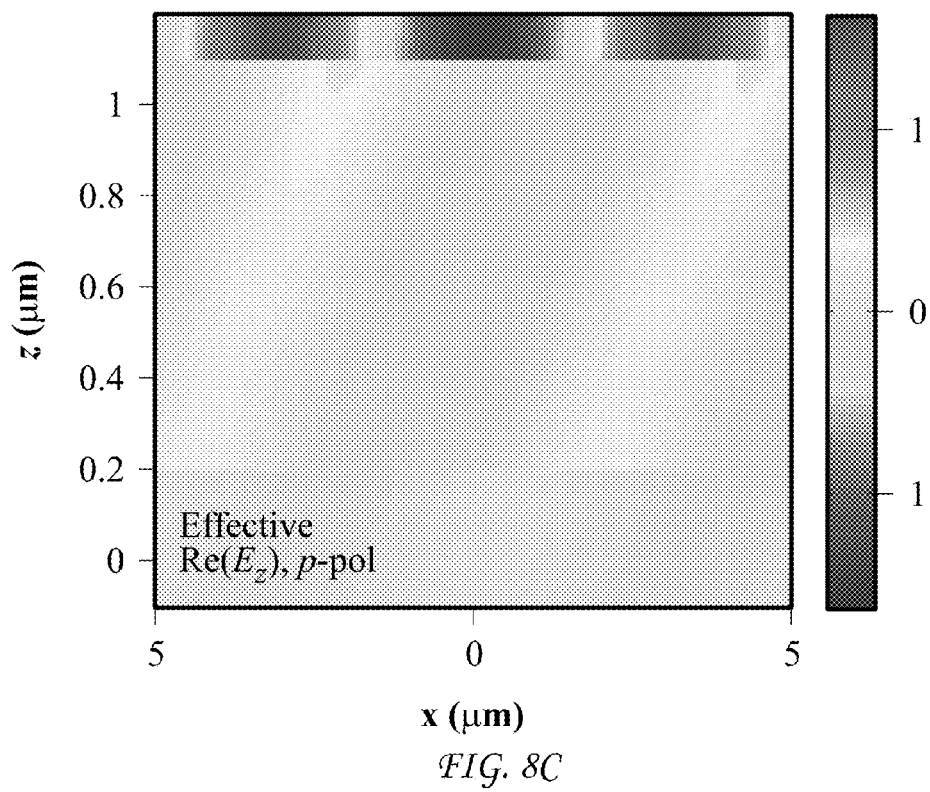
FIGS. 8C and 8D are graphs of field profiles under p-pol incidence. The results in FIGS. 8A and 8C were computed using the effective medium approximation. The results in FIGS. 8B and 8D were computed using the superlattice implementation.
Figure 8D:
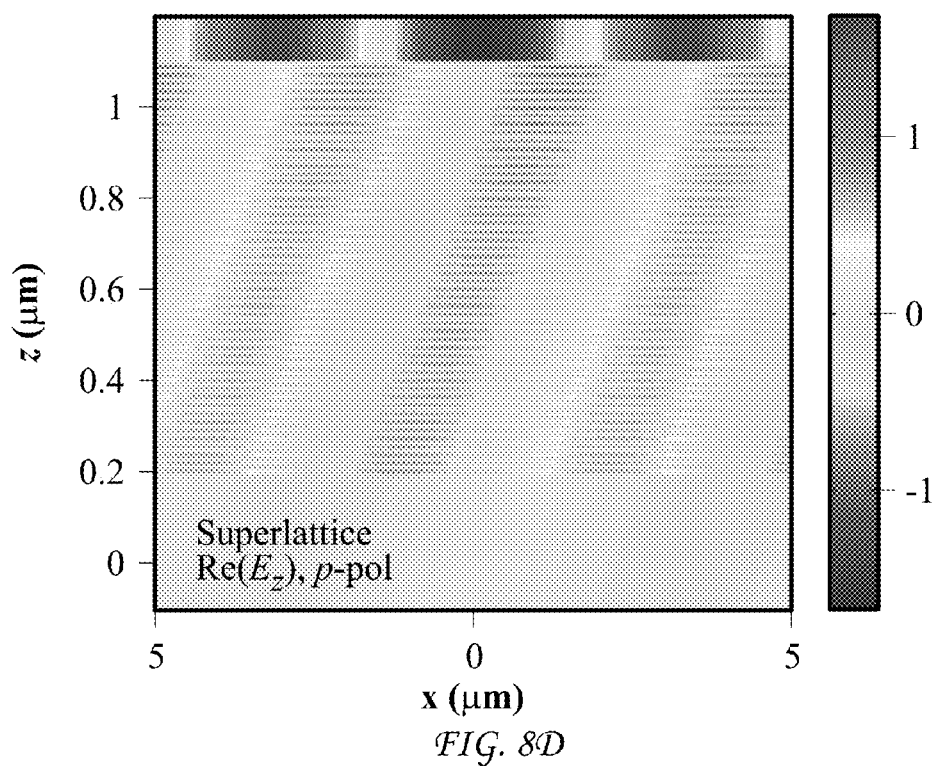
Figure 8E:
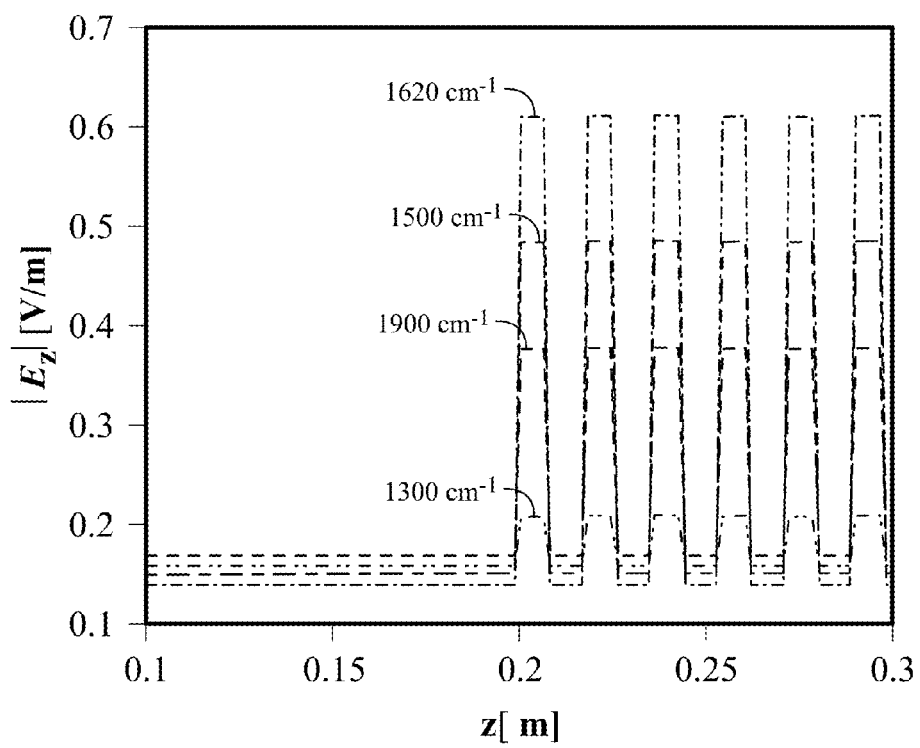
FIG. 8E is a graph of the line profiles of the field at x=−2 μm across the first six doped layers. The fields are stronger at 1620 cm$^{-1}$, leading to a stronger absorptivity in FIGS. 2C and 2D.

To further understand the origin of the thermal emission behavior, the electric field profiles within the SHM were investigated using both the superlattice model and the effective medium approximation. FIGS. 8A-E show the field profiles corresponding to a frequency of 1620 cm$^{-1}$ and incidence angle of 74 degrees. Note that this frequency is close to the epsilon-near-zero conditions of $\epsilon_z^m$ and $\epsilon_z^{eff}$. For the s-polarized field profile, the real part of the y-component of the electric field is plotted in FIG. 8A and FIG. 8B, while for the p-polarized profile, the z-component of the electric field is plotted in FIG. 8C and FIG. 8D. Once again, a very good agreement between the effective medium and the superlattice models is obtained. However, for the p-polarized case, the uniform electric field observed in the effective medium model (FIG. 8C) actually corresponds to a field concentration occurring in the doped quantum wells (FIG. 8D). FIG. 8E shows a line profile (for x=−2 μm) of the real part of the z-component of the electric field for p-polarized incidence at 74 degrees for four different frequencies. Of these four frequencies, the largest fields occur at ~1620 cm$^{-1}$, which is close to the frequency at which $|\epsilon_z^m|$ attains its smallest value of ~2.25 ($\epsilon_z^m$=0.67+i2.149). In this case, the continuity of the total displacement field normal to the surface suggests that the largest field should occur within the doped layer (provided the sample is not highly reflecting). See S. Vassant et al., *Physical Review Letters* 109, 237401 (2012); and S. Campione et al., *Physical Review B* 87, 035120 (2013).

The absorption is proportional to the imaginary part of the permittivity and the magnitude squared of the field. A figure-of-merit that embeds these two quantities is $$\text{Im}(1/\epsilon_z) = -\frac{\text{Im}(\epsilon_z)}{|\epsilon_z|^2}.$$

Figure 9:
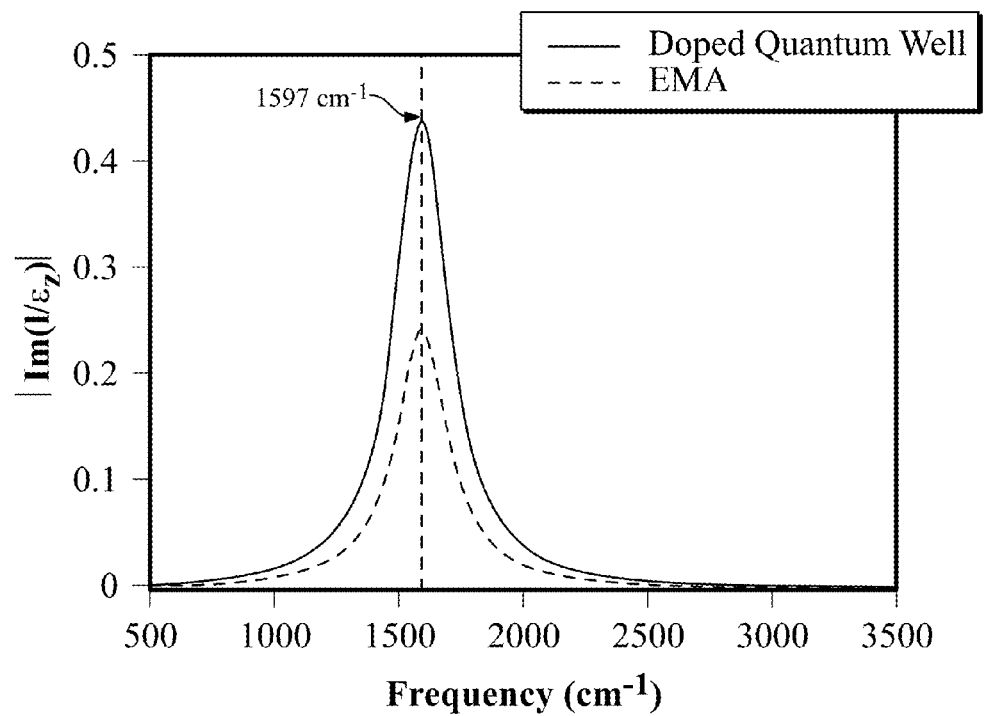
FIG. 9 is a graph of the magnitude of Im(1/∈$_z$) versus frequency calculated using the measured permittivity of the doped quantum well and the effective medium model. Both models show peaks at 1597 cm$^{-1}$.

FIG. 9 shows Im(1/$\epsilon_z^m$) of the doped quantum well, along with Im(1/$\epsilon_z^{eff}$) calculated using the effective medium model. A pronounced maximum is observed at 1597 cm$^{-1}$ for both models, which is very close to the peak of the absorption/emission curves. Although this absorption peak does not occur precisely at the ENZ frequency (i.e. where Re($\epsilon_z$)=0), it is characterized by a small real part and large imaginary part of the permittivity which arise directly from the ENZ resonance. It is important to note that the correspondence of the peak absorption frequencies obtained with the two models is not a coincidence: inspection of the effective medium equations shows explicitly that Im(1/$\epsilon_z^{eff}$)=f·Im(1/$\epsilon_z^m$), where f is the metal filling fraction. Thus, the spectral region of maximum absorption is solely dictated by the permittivity of the doped layer.

TABLE 1

| | Parameters for Cases 1-3 differing from the superlattice in FIG. 1A. | | | |
|---|---|---|---|---|
| Case | Doped layer thickness [nm] | Undoped layer thickness [nm] | Metal filling fraction (f) | Number of pairs |
| 1 | 11 | 4 | 0.73 | 60 |
| 2 | 9 | 9 | 0.5 | 50 |
| 3 | 5 | 10 | 0.33 | 60 |

Figure 10A:
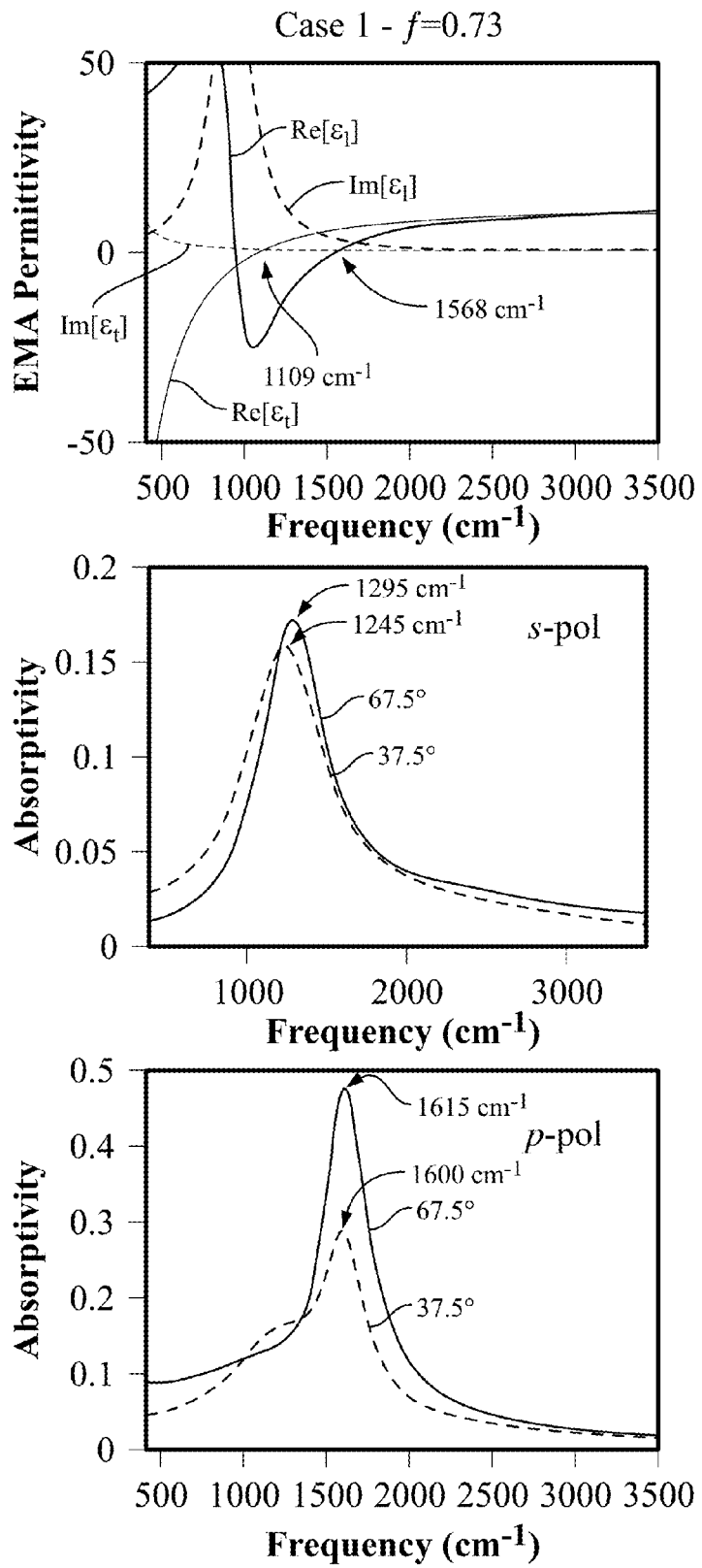
FIGS. 10A-C are graphs of the effective permittivity functions of the homogeneous SHM (top row), and theoretical absorptivity for s-pol (central row) and p-pol (bottom row) light for three SHM cases.
Figure 10B:
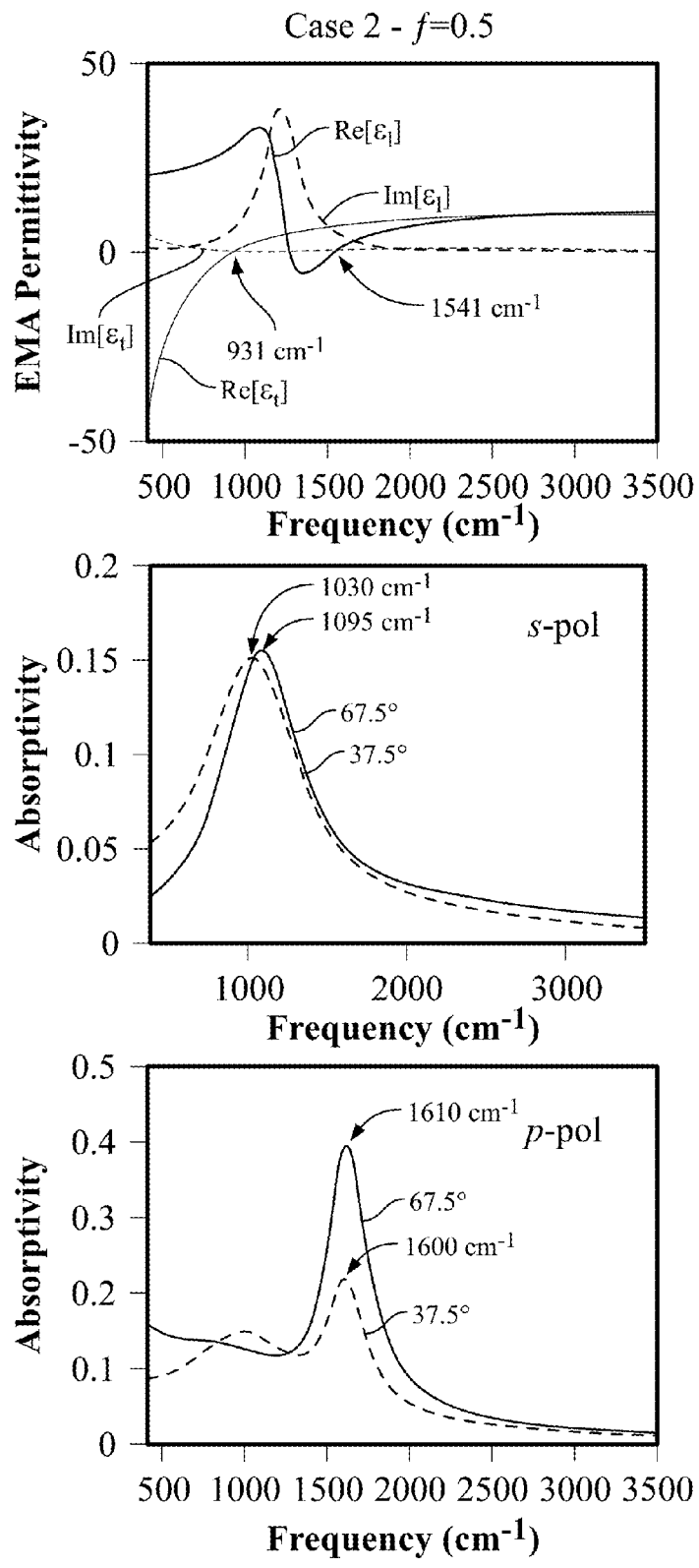
Figure 10C:
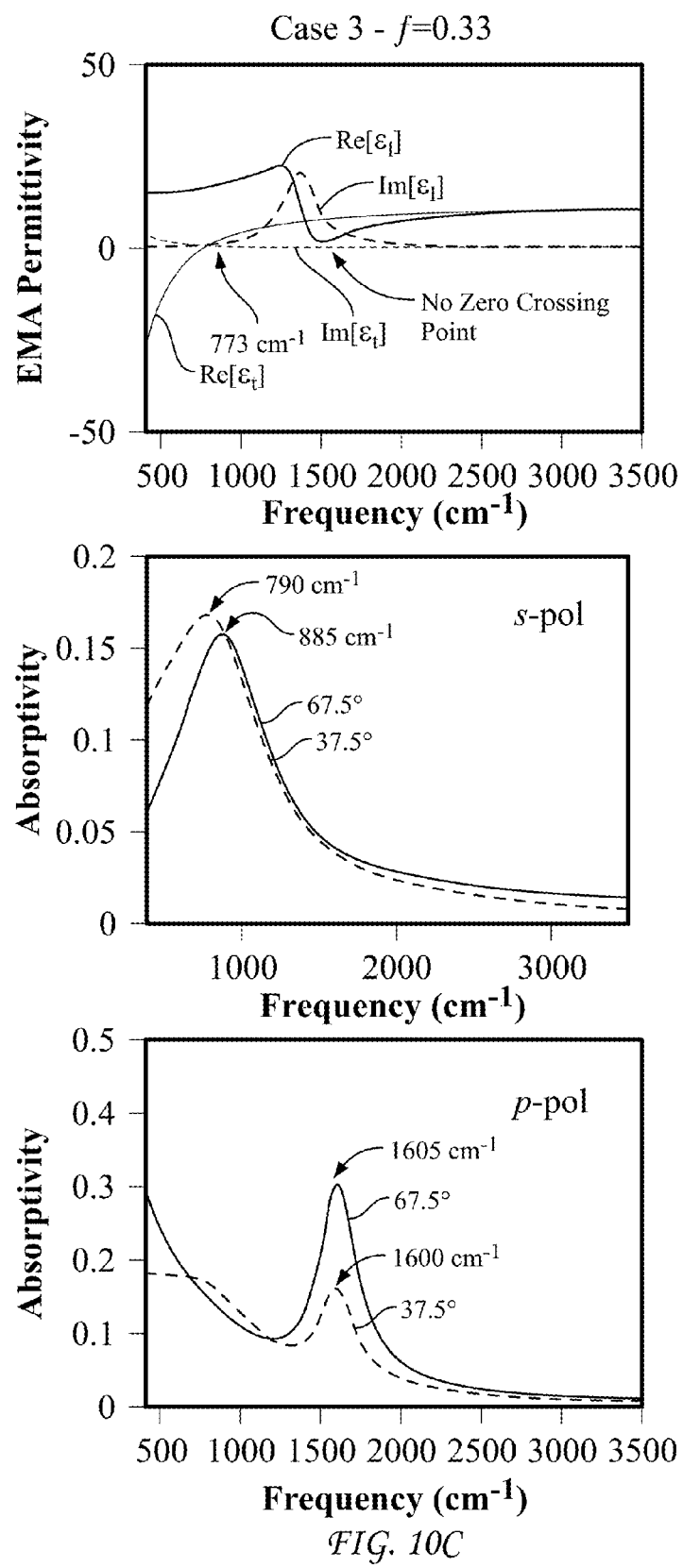

To demonstrate the validity of the figure-of-merit, the absorptivity was numerically calculated for three different structures that are closely related to the structure shown in FIG. 1A. The permittivities of the doped and undoped semiconductor layers are kept the same as those of FIG. 1A, while the thicknesses of the layers are varied to vary the metal filling fraction (see Table 1). For each case, the number of layer pairs is modified to keep the same overall thickness of the SHM. The effective medium permittivities and polarized absorptivities corresponding to these cases are shown in FIGS. 10A-C. As seen in the figure, a p-polarized absorption maximum is obtained near ~1600 cm$^{-1}$ for all three cases, including Case 3 that does not support an ENZ condition of $\epsilon_z^{eff}$, and Re($\epsilon_z^{eff}$)>1. Since the underlying permittivities of the doped layers is the same in all cases, the figure-of-merit also predicts the peaks of Im(1/$\epsilon_z^{eff}$) will occur at the same frequency for all cases. This confirms that the p-polarized absorption peak is associated with an epsilon-near-zero condition of the longitudinal component $\epsilon_z^m$ of the doped quantum wells, and supports the assertion that knowledge of the optical characteristics of the layers composing the SHM stack is necessary for a good understanding of the observed optical properties.

In general, the thermal emitter can comprise any semiconductor hyperbolic metamaterial comprising periodic alternating layers of a doped semiconductor material and an undoped semiconductor material forming a plurality of quantum wells, wherein the period is subwavelength to emitted infrared light and wherein the wavelength of emitted infrared light occurs near the epsilon-near-zero condition of the doped semiconductor material layers. Indeed, in principle, such a thermal emitter can be obtained with a single quantum well, if sufficient field enhancement can be generated with low loss materials. Further, although the above example uses a doped InGaAs quantum well and undoped InAlAs barriers, other quantum well/barrier combinations can also be used. For example, doped GaAs can be used as the quantum well and AlGaAs as the barrier. Alternatively, doped InAs can be used as the quantum well and GaSb as the barrier. Other heterostructure stacks of 2D quantum material can also be used, such as ultrathin layers of hexagonal boron nitride or transition metal chalcogenides. The periods need to be deeply subwavelength, meaning the thickness needs to be much less than $\lambda/2n$, where $\lambda$ is the wavelength of interest and n is the real part of the index of refraction in the z direction. In the example above, the periodicity is 18 nm, or about 0.003 of the free space wavelength. Therefore, the periodicity is preferably less than one-tenth and, more preferably, less than one-hundredth of the wavelength of the emitted infrared light. Further, the dopant density of the quantum well material must be sufficient to achieve an epsilon-near-zero condition at the desired wavelength of the emitted infrared light. In the example above, the dopant density of the InGaAs quantum well material was $2\times10^{19}$ cm$^{-3}$. For example, the barrier material can have its intrinsic concentration.

The present invention has been described as a thermal emitter comprising near-zero permittivity materials. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A thermal emitter, comprising:
a semiconductor hyperbolic metamaterial comprising periodic alternating layers of a doped semiconductor material and an undoped semiconductor material forming a plurality of quantum wells, wherein the period is subwavelength to emitted infrared light and wherein the wavelength of emitted infrared light occurs near the epsilon-near-zero condition of the doped semiconductor material layers.

2. The thermal emitter of claim 1, wherein the wavelength of the emitted infrared is between 2.5 and 25 microns.

3. The thermal emitter of claim 1, wherein the periodicity is lees than, one-tenth the wavelength of the emitted infrared light.

4. The thermal emitter of claim 1, wherein the dopant density of the doped semiconductor material is sufficient to achieve an epsilon-near-zero condition at a desired wavelength of the emitted infrared light.

5. The thermal emitter of claim 4, wherein the dopant density of the doped semiconductor material is greater than $2\times10^{19}$ cm$^{-3}$.

6. The thermal emitter of claim 1, wherein the doped semiconductor material comprises InGaAs and the undoped semiconductor material comprises InAlAs.

7. The thermal emitter of claim 1, wherein the doped semiconductor material comprises GaAs and the undoped semiconductor material comprises AlGaAs.

8. The thermal emitter of claim 1, wherein the doped semiconductor material comprises InAs and the undoped semiconductor material comprises GaSb.

* * * * *